(12) United States Patent
Bush

(10) Patent No.: US 6,291,985 B1
(45) Date of Patent: Sep. 18, 2001

(54) DEMAND-RELAY-REPORTING ELECTRONIC WATTMETER WITHOUT A CURRENT TRANSFORMER SENSOR

(76) Inventor: E. William Bush, 6389 La Jolla Scenic Dr. South, La Jolla, CA (US) 92037

( * ) Notice: Subject to any disclaimer, the term of this patent is extended or adjusted under 35 U.S.C. 154(b) by 0 days.

(21) Appl. No.: 08/731,298

(22) Filed: Oct. 15, 1996

Related U.S. Application Data

(60) Provisional application No. 60/005,313, filed on Oct. 16, 1995.

(51) Int. Cl.[7] .................................................... G01R 7/00
(52) U.S. Cl. .............................................................. 324/142
(58) Field of Search .............................. 324/142; 702/60, 702/61, 62, 64, 65; 323/220, 223, 224, 233; 340/870.02; 363/123, 126

(56) References Cited

U.S. PATENT DOCUMENTS

| | | | |
|---|---|---|---|
| 4,978,911 | * 12/1990 | Perry et al. | 324/142 |
| 5,258,704 | * 11/1993 | Germer et al. | 324/142 |
| 5,391,983 | * 2/1995 | Lusignan et al. | 324/142 |
| 5,450,007 | * 9/1995 | Payne et al. | 324/141 |
| 5,537,029 | * 7/1996 | Hemminger et al. | 324/142 |

* cited by examiner

Primary Examiner—Ernest F. Karlsen
Assistant Examiner—Russell M. Kobert
(74) Attorney, Agent, or Firm—Fuess & Davidenas

(57) ABSTRACT

An electronic wattmeter is full-floating relative to a source of alternating current (a.c) voltage power that it serves to monitor. It is so full-floating by virtue of a direct current, d.c., power supply that is full floating relative to a.c. ground, and that produces a d.c. voltage that is impressed upon the a.c. voltage, meaning that the d.c. ground is equal to the a.c. voltage. A sense resistor is located in series between the source of a.c. electrical power and an a.c. load. Three resistive voltage dividers respectively between (i) the a.c. voltage at the source side of the sense resistor and a.c. ground, (ii) the a.c. voltage at the source side of the sense resistor and d.c. ground, and (iii) the a.c. voltage at the load side of the sense resistor and d.c. ground, respectively develop at their center taps logic-level, low, (i) first, (ii) second, and (iii) third voltages. The first voltage is indicative of the instantaneous a.c. voltage; the difference between the second voltage and the third voltage is indicative of the instantaneous current though the sense resistor, and thus the load. A multiplier, normally a microprocessor, multiplies the sensed instantaneous voltage by the sensed instantaneous current to develop the instantaneous power, in watts, that is being provided by the source of a.c. electrical power to the load. Integration of this instantaneous power over time provided from a time base, preferably a real time clock, permits further derivation of the total electrical energy, in kilowatt hours, that is provided by the source of a.c. electrical power to the load.

13 Claims, 4 Drawing Sheets

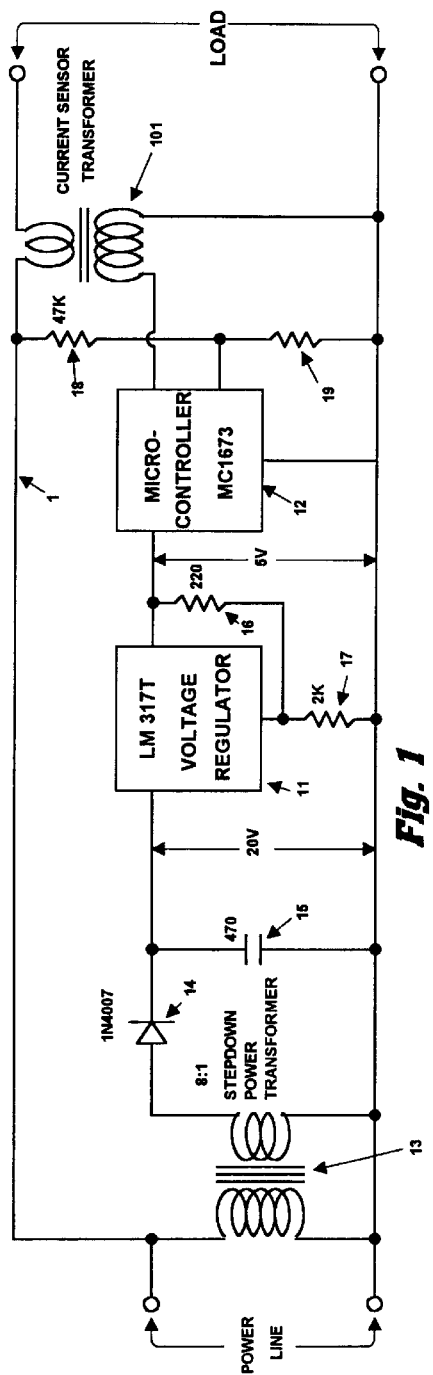
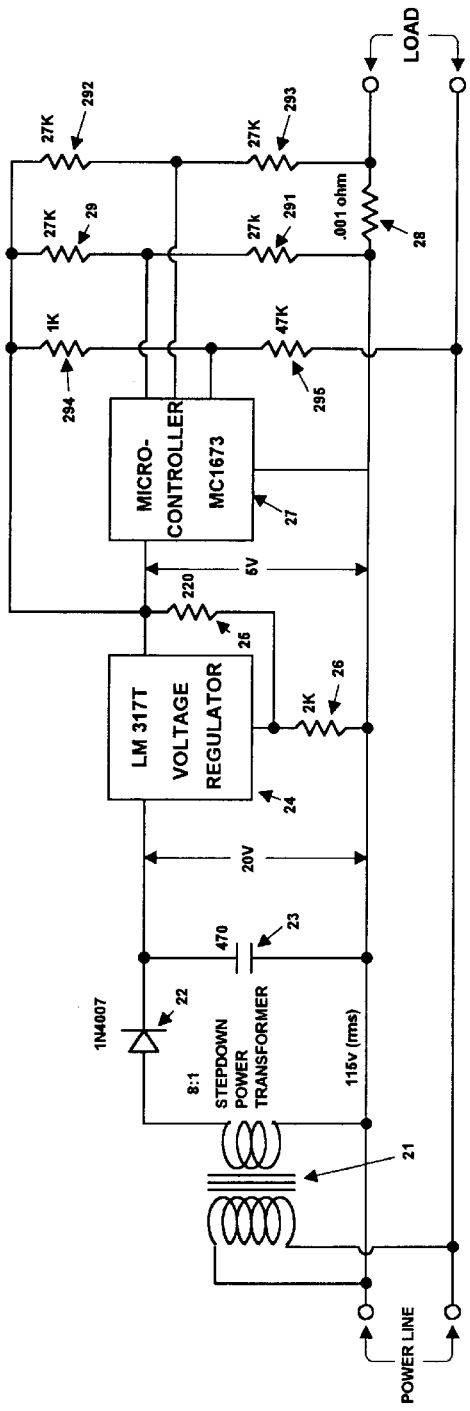
Fig. 1 PRIOR ART
Fig. 2

PRICED BILL OF MATERIAL

| # | Description | Part Number | Manuf. | Dist. | REFERENCE DESIGNATOR | QUOTE QTY | Qty. | EA. | Cum | COMMENT |
|---|---|---|---|---|---|---|---|---|---|---|
| 1 | Lexan Cover | 5" dia. X 4" (1/8" wall) | Moldesign | | | | 1 | $0.850 | $0.85 | Quote (Tooling not included) |
| 2 | Marmon Clamp | | | | | | | | $0.00 | Eliminated |
| 3 | Copper contacts | 1/8 in. | | | | | 3 | $0.400 | $1.20 | ROM |
| 4 | Base Housing | | Moldesign | | | | 1 | $1.200 | $1.20 | Quote (Tooling not included) |
| 5 | Misc. Hardware | Nuts, Bolts, Washers | | | | | 12 | $0.030 | $0.36 | ROM |
| 6 | P.C. Board | Commercial Grade | | | | | 1 | $0.350 | $0.35 | From commercial project |
| 7 | Resistors | 1/4 Watt, 5% | Carbon film | TTI | R1 THRU R28 | | 28 | $0.006 | $0.17 | Many will be eliminated with IC |
| 8 | Capacitors | NMCO805NPO470J50 | | Deanco Inc. | C1 THRU C37 | | 37 | $0.019 | $0.70 | Many will be eliminated with IC |
| 9 | Output Transistor | 2N2222A | Motorola | TIME | Q1,Q2 | | 2 | $0.283 | $0.57 | Will be replaced by IC. |
| 10 | Current Sensors | CS60-010 | Coil Craft | Coil Craft | | | 2 | $0.000 | $0.00 | Eliminated by floating power supply |
| 11 | Micro Processor | MC16C71-04P | Microchip | Insight | | | 1 | $3.430 | $3.43 | Motorola possible replacement |
| 12 | EEPROM (1K) | MC93LC56SN | Microchip | Insight | | | 1 | $0.430 | $0.43 | Changed from 93C46 to 93C56 |
| 13 | Reset Control | DC1233-10 | Dallas | AVED Inc. | | | 1 | $0.670 | $0.67 | Safe Guard only. |
| 14 | Receiver IC | MC13135 | Motorola | TIME | | | 1 | $2.330 | $2.33 | Compromise choise |
| 15 | UHF Transmitter | MC13176 | Motorola | TIME | | | 1 | $1.750 | $1.75 | Catalog $3.05ea at a qty of 48pcs. |
| 16 | R.F. Switch | MRF1C2003 | Motorola | TIME | | | 1 | $0.500 | $0.50 | Diode/Logic replaced R.F. Switch |
| 17 | DC/DC Converter | MAX610 | Maxim | | | | 1 | $0.480 | $0.48 | LM-317 quote |
| 18 | Filter, 1st IF(10.7MHZ) | SFE-10.7MJ-10A | muRata | TIME | | | 1 | $0.320 | $0.32 | Will be replaced by IC. |
| 19 | Display (4 diget) | 3900-363-470 Reflecti | Standish | Standish | | 5000 | 1 | $2.500 | $2.50 | Many to chose from. |
| 20 | Filter, 2nd IF(455KHZ) | CFU455B2 | muRata | TIME | | | 1 | $0.800 | $0.80 | Will be replaced by IC. |
| 21 | Crystal (32.768 KHz) | R38-32.768 | Raltron | Kelex Elct. | X1,X2,X3 | | 3 | $0.220 | $0.66 | Quantity will be reduced ultimately |
| 22 | Super Capacitor | FYOH224Z | NEC | BELL | | | 1 | $1.190 | $1.19 | Many to chose from. |
| 23 | Transistor | MPS5179 | Motorola | | Q4,Q3 | | 2 | $0.270 | $0.54 | Catalog price. Replace with IC |
| 24 | Transistor | NTE311 | | | Q5 | | 1 | $0.500 | $0.50 | ROM, replace with IC |
| 25 | Transistor | 3N4402 | Motorola | Q6 | | 2000 | 1 | $0.180 | $0.18 | Used catalog price (can be improved) |
| 26 | Potentiomter, Calibration | | | | R29 THRU R33 | | 4 | $0.250 | $1.00 | Will design to eliminate |
| 27 | Coils (Wire) | 12 in. enough for all | | | L1 THRU L7 | | 1 | $0.120 | $0.12 | Will be eliminated with IC |
| | | | | TOTAL MATERIAL | | | | | $22.80 | Material only |
| | | | | BURDEN & LABOR | | | | | $3.42 | This factor includes labor. |
| | | | | TOTAL COST | | | | | $26.22 | |
| | | | | PROFIT | | | | | $3.93 | 15% Target |
| | | | | TOTAL | | | | | $30.15 | Initially ball park $75. |

Fig. 5

DEMAND-RELAY-REPORTING ELECTRONIC WATTMETER WITHOUT A CURRENT TRANSFORMER SENSOR

RELATION TO RELATED PROVISIONAL UTILITY, PATENT APPLICATIONS

The present patent application is related to and descended from U.S. provisional patent application Ser. No. 60/005,313 filed on Oct. 16, 1995, for a DEMAND-RELAY-REPORTING ELECTRONIC WATTMETER WITHOUT A CURRENT TRANSFORMER SENSOR to the same E. William Bush who is the inventor of the present application..

The present patent application is also related to a pending U.S. utility patent application Ser. No. 08/731,299 filed on an even date herewith for DEMAND REPORTING OF ELECTRICITY CONSUMPTION BY RADIO IN RELAYS TO A BASE STATION, AND DEMAND RELAY WATT-METERS SO REPORTING OVER A WIDE AREA to the selfsame inventor of the present patent application. The related utility patent application is also descended from a provisional patent application. The contents of the related utility patent application are incorporated herein by reference.

BACKGROUND OF THE INVENTION

1. Field of the Invention

The present invention generally concerns electronic wattmeters as are commonly used by electrical utilities in the monitoring and reporting of electricity usage by homes and by businesses.

The present invention particularly concerns electronic wattmeters that have no current transformer for the sensing of current consumption, and that report measured and monitored electricity consumption (i) by radio (ii) on demand (iii) in relays to a base station.

2. Description of the Prior Art 2.1 General Requirement Circa 1990 for An Electronic Power Meter U.S. electrical utilities have desired for some time power meter features and capabilities that the traditional electromechanical power meter cannot provide. However, these desires have not as of yet, circa 1995, been considered sufficient justification for a complete one-for-one replacement of existing residential power meters.

Without the market scale which would be dictated only by wholesale replacement of existing residential power meters, electronic meters have been relegated to niche markets. Now (circa 1995), however, electrical utilities face the new requirement of wheeling. With the advent of Wheeling, utilities *are willing to consider a complete replacement of the existing electromechanical meters. It is desired that a more powerful electronic meter would be produced at a price comparable to, or less than, the existing electromechanical meter.

Utilities throughout the United States recognize that Wheeling is rapidly becoming a reality and the resulting competition will dictate the adoption and utilization of a new metering technology. Many new and interesting metering products are becoming available, but to date these products have targeted small niche markets. The price and longevity of the electromechanical meters have prevented direct competition for the large residential market. However, wheeling [defined and further discussed in the fourth paragraph hereinafter] now provides the opportunity to upset this long-standing impasse.

The requirements for electric utility metering in the United States are driven by the customer. There is a general concern for customer satisfaction in the utility industry which is being driven to some degree, circa 1995, by the prospect of wheeling. The specific areas where utilities are interested in improving their customer interface are in offering (i) variable rates for load management, (ii) direct load curtailment, (iii) time of use (TOU) information, (iv) security, and revenue protection, (v) reduced expenses in meter reading, and (vi) customer interactive communications.

At the present time there appears to be an abundance of reasons for the U.S. utility industry to anticipate changes and prepare to operate competitively in a significantly different business environment. Some of the factors that contribute to the changes are include: (i) the present and long term United States economics trend of expansion, (ii) wheeling, (iii) electric vehicles, and (iv) new technology.

Detailed discourse regarding the US economy is beyond the scope of this disclosure. However, U.S. electric utilities have been seriously affected in the past by varying interest rates. Power generation expansion that requires borrowed capital could put a utility at risk.

Wheeling became a reality when the Public Utility Regulatory Policies Act of 1978 (PURPA) amended the Federal Power Act and gave the Federal Energy Regulatory Commission (FERC) expanded responsibilities for the encouragement of co-generation and small power production using alternative energy technologies. See Electric Power Wheeling and Dealing, Technological Considerations for increasing Competition; Congress of the United States Office of Technology Assessment PP 55. The goals of PURPA were to advance: 1) conservation of electric energy, 2) increased efficiency in electric power production, and 3) achievement of equitable retail rates for consumers. This was advanced in large part by requiring utilities to interconnect with and buy power from co-generators and small power producers that met standards established by FERC. This was the first major Federal move to open up electricity markets to non-utilities.

There have been other amendments to the Act of 1978 and all the utilities that were contacted in our market survey are preparing for the added competition that the act allows. In this relative new competitive environment, the energy will be billed to the utility that can provide the best service at the lowest cost. Better service can be accomplished by: 1) instantaneous readouts for shut-offs, turn-ons, verification, etc. 2) TOU (time of use) profiles which will allow rate change allowances, 3) faster and more accurate billing and 4) demand load control. Finally, the lower cost will result from: 1) manual meter reading elimination, 2) load leveling, and 3) improved customer relations.

Another government mandate that is destined to impact the utility industry is electric vehicles. Air pollution has prompted the State of California to establish quotas for non-polluting (electric) vehicles in the Los Angeles area. Not only will the use of electric vehicles increase the need for electrical energy, but a new metering concept will be required. At least one utility is currently buying communications equipment so that each electric vehicle can have it's own individual power meter. This allows the utility company to appropriately charge the vehicle owner irrespective of where the vehicle batteries are recharged. The magnitude of the added energy usage requirement is clearly brought into perspective in realizing that the energy requirements for an electric vehicle would about parallel the usage of a typical residence.

It is interesting and important to note that the DRM system proposed here would exactly satisfy the electric vehicle metering requirements. A readout could be accomplished at any time when the vehicle is domiciled at a designated location. Alternatively a search and read program could be implemented to perform a readout anywhere in the utility service area.

A number of advancements in new technology can now provide the basis for a significantly different residential power meter. Microprocessors have been developed for large volume applications, particularly for the automotive industry, and RF integrated circuits have been developed for large volume application such as commercial radios, pagers and portable telephones. The large volume is the ingredient that dictates the economics, and these particular components are directly applicable to the power meter application.

2.1 General Objectives of a New Electronic Power Meter

An increased-capability electronic power meter should be provided at a price comparable to the existing residential electromechanical power meter. However, capabilities will be enhanced. The desired new capabilities include the following:

A new electronic power meter would desirably offer built-in two-way RF communications for automatic remote meter reading.

It would retain hourly time-of-use (TOU) measurements for 30 days. Alternatively, it would retain TOU measurements every 2½ minutes for 2 hours, A new electronic power meter would desirably offer record the time of, and send an alarm, at the onset of any tampering so as to help preclude energy theft.

It would desirably provide a remote display for customer communications.

Finally, a new electronic power meter would desirably provide output control for load curtailment.

The new electronic power meter should have an operational life of at least 15 years with a failure rate of less than 1% per year, and normally much, much less. Electronic devices can easily achieve this stringent operational requirement. A new electronic power meter would in particular be designed with proper derating and overall conservatism to guarantee the prescribed long life, target costs and performance.

2.1 Specific Objective of a New Electronic Power Meter

One obstacle to a cost-effective implementation of an all-electronic wattmeter is presented by a particular standard component of an electronic wattmeter: the current sensor transformer.

Consider first that the electronics of any electronic wattmeter require, by definition that they are "electronics" a source of power that is low voltage, i.e., about 5 v.d.c., relative to the power that is monitored, normally 120 v.a.c. or 220 v.a.c. The necessary low-voltage power source requires, when implemented by conventional means, a step-down power transformer in the ratio of approximately eight to one. A minimum of eight plus one, or nine, turns are required in the coil of such an 8:1 step-down power transformer. This requires a component that is typically of some fraction of a U.S. dollar in cost, or as much as the electronic "chips" themselves of the electronic wattmeter cost when produced in mass quantities (circa 1995).

Worse, yet another transformer — the current sensor transformer — is required. The electronic wattmeter operational at low voltage clearly cannot directly connect to, or sense, the much higher a.c. voltage the consumption of which is monitored. The power consumption to be monitored, in watts, is the product of load voltage in volts times load current in amperes. The load voltage can be scaled to an appropriate level in a simple and inexpensive resistive divider. However, the load current is determined by a current sensor transformer the primary coil of which is inserted in the path of the input a.c. current.

Responsively to the a.c. current (to the load) in the primary coil of the current sensor transformer, a current is developed in the secondary coil of the same transformer. This current may be dropped across an input resistance of the sensor electronics, developing a voltage that may suitably be interpreted in the electronics as a measure of current to the load. When this sensed current is multiplied by the load voltage then the instantaneous power being delivered to the load is developed. Power consumption in watt hours is simply an integration of this instantaneous power over time.

The current developed in a secondary coil of the current sensor transformer as dropped across the input resistance of the electronic sensor circuit is desirably always less than the d.c. supply voltage on which the sensor electronics are operative, and less than the reference voltage, if the required accuracy of comparison between sensed voltage and reference voltage is to be obtained. This means that the current sensor transformer, like the step-down power transformer, must have a certain minimum number of turns. Moreover, the primary coil of the current sensor transformer is a part of, and is serial in line, the main a.c. power bus (the power consumption of which bus is monitored).

Accordingly, this coil winding must be large and robust, and is typically of heavy gauge copper wire.

According to these requirements, the current sensor transformer is a substantial part that cannot be made as inexpensively as would be desirable, and as would compare favorably with the few pennies cost of other components of the electronic wattmeter, a current sensor transformer costing typically a number of U.S. dollars (circa 1995).

According to the fact that the cost of the two inductive components of an electronic wattmeter commonly equal, or exceed, the costs of the electronic chip components, a design improvement that would eliminate, or minimize, the cost of these inductive components would be desirable.

SUMMARY OF THE INVENTION

The present invention contemplates an electronic wattmeter that, by virtue of being full-floating relative to a source of alternating current (a.c) voltage power, has no current transformer sensor. Because it is floating relative to the a.c. power that it serves to monitor, the transformer-less electronic wattmeter monitors a.c. current directly as the voltage drop occurring across a low ohm resistor placed in series between the source of a.c. voltage power and a load.

The electronic wattmeter is further expandable into a "Demand Relay Meter", being a monitor of the consumption of electrical power that reports both instantaneous power consumption in watts, and watt-hours electricity consumption over time, by radio on demand, and via relays, to a central utility monitoring station.

The preferred embodiment of an electronic wattmeter in accordance with the present invention is intended for use with a source of a.c. electrical power, normally a power grid, that is supplying a.c. voltage electricity to a load, normally a building or the like. More specifically, a source of a.c. electrical power provides an a.c. voltage across a load connected to a.c. ground.

The preferred wattmeter includes a direct current power supply, floating relative to a ground, that produces a direct current (d.c) voltage that is impressed upon the a.c. voltage. In other words, the d.c. ground is full floating, and is in fact the same as the a.c. voltage.

A sense resistor is located in series between the source of a.c. electrical power and the load.

A first resistive voltage divider is located between (i) a side of the series resistor that is connected to the source of a.c. electrical power and (ii) a.c. ground. A center tap of this first resistive voltage divider develops a first voltage that is of a magnitude suitable to be received into a logic circuit, in other words a low voltage.

A second resistive voltage divider is located between (i) the side of the series resistor that is connected to the source of a.c. electrical power and (ii) the full-floating d.c. ground. A center tap of this second resistive divider develops a third voltage.

A third resistive voltage divider is located between (i) a side of the series resistor that is connected to the load and (ii) the full-floating d.c. ground. A center tap to this third resistive divider develops a second voltage.

A sensing means that is full floating relative to a.c. ground receives the first and second and third voltages. The sensed first voltage is indicative of the instantaneous a.c. voltage from the source of a.c. electrical power. The difference between the second voltage and the third voltage is indicative of the instantaneous voltage drop across the sense resistor, and thus of the instantaneous current though the sense resistor, and thus nearly of the identical instantaneous current (save only for the infinitesimal amount passing through the third resistive voltage divider) supplied into the load.

A multiplier multiplies the sensed instantaneous voltage by sensed instantaneous current to develop the instantaneous power, in watts, that is provided by the source of a.c. electrical power to the load.

A time base, preferably a real time clock, may further be provided as source of time. In this case the multiplier, which is commonly implemented as a microprocessor, also receives (real) time, and uses this time to integrate the instantaneous power, in watts, in order to produce the total electrical energy, in kilowatt hours, that is provided by the source of a.c. electrical power to the load.

Because power is lost in the series resistor due to current in the load, this resistance is normally very small, and is preferably less than 0.1 ohm and more preferably 0.02 ohm.

The resistances of the two resistors in the first resistive voltage divider are such so as to make the first voltage of a proper level, and are normally in a ratio of less than one in fifty (<2%), and are commonly 1K ohms and 47K ohms.

The resistances of each of the two resistors in each of the second and the third resistive voltage dividers are preferably respectively equal to the resistances of the other divider, and are more preferably equal to each other — thus making that all the four resistors of the two resistive dividers are of equal ohms value, and are commonly 27K ohms.

The preferred sensing means includes an analog to digital (A/D) converter for first sensing and for second sensing, and a microprocessor for multiplying. The preferred (A/D) converter must be sensitive to small a.c. currents across the (preferably) small series resistor, and is normally so sensitive, having better than millivolt sensitivity.

As previously stated, the preferred multiplier is a microprocessor.

The preferred A/D converter and preferred microprocessor are preferably integrally packaged. They may be, for example, part number MC 16C71-04P available from Motorola, Inc., or equivalent.

The time base preferably maintains real time. The preferred microprocessor may thus integrate measured watts electricity consumption over time to develop electrical power consumption in watt hours over standard periods, such as over calendar weeks or months.

The preferred microprocessor is further preferably digitally interfaced to each of a radio (i) transmitter, and (ii) receiver, and is programmed to report by radio in response to demands received by radio each of the instantaneous rate of electricity consumption (watts) and the consumption of electricity over a period (watt-hours). The preferred communications, and communications protocol, may be from one radio-communicating sensing means to another as a relay ultimately reaching to an demand-originating, and usage information receiving, central station.

These and other aspects and attributes of the present invention will become increasingly clear upon reference to the following drawings and accompanying specification.

BRIEF DESCRIPTION OF THE DRAWINGS

FIG. 1 is a schematic block diagram showing a prior art electronic wattmeter.

FIG. 2 is a schematic block diagram showing a current transformer-less electronic wattmeter in accordance with the present invention.

FIG. 5 is a table showing a parts list of the preferred embodiment of the Demand Relay Meter, incorporating the preferred embodiment of the current transformer-less electronic wattmeter in accordance with the present invention, that was previously seen in FIGS. 3 and 4.

DESCRIPTION OF THE PREFERRED EMBODIMENT

Figure 3:
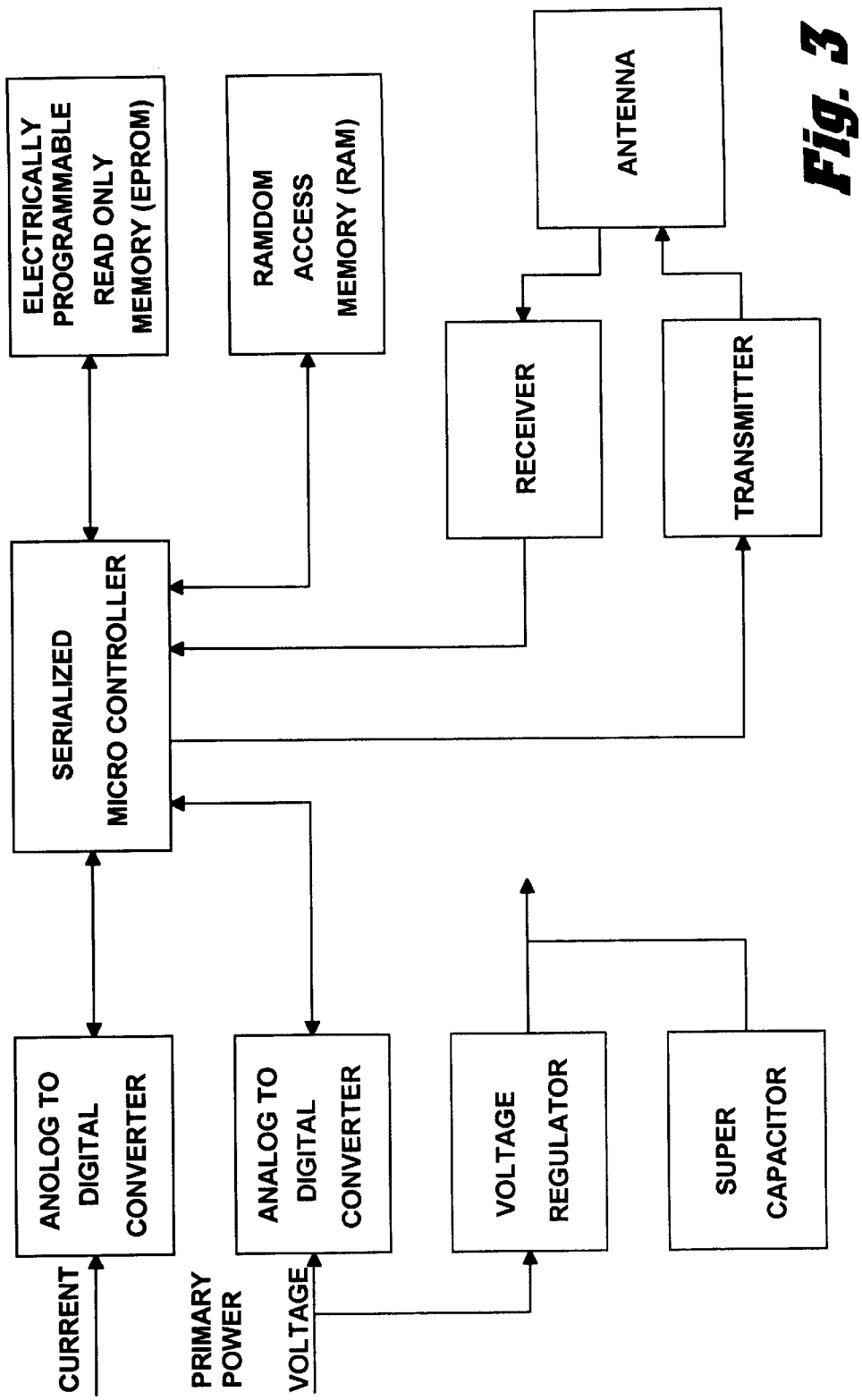
FIG. 3 is a schematic block diagram of a preferred embodiment of a Demand Relay Meter incorporating the preferred embodiment of a current transformer-less electronic wattmeter in accordance with the present invention previously seen in FIG. 2.

A schematic block diagram of a prior art electronic wattmeter 1 is shown in FIG. 1. The "electronics" such as the VOLTAGE REGULATOR 11 and MICROCONTROLLER 12 require low voltage, normally 5 v.d.c.. Meanwhile the POWER LINE power that is monitored is normally 120 v.a.c. or 220 v.a.c. The necessary low-voltage power is produced first in 8:1 STEP-DOWN POWER TRANSFORMER 13, diode 14 type 1N4007 and capacitor 15 value 470 microfarads that collectively produce a half-wave-rectified and filtered 20 v.d.c., and then in the VOLTAGE REGULATOR 11 and bias resistors 16 of value 220 ohms, and 17 of value 2K ohms that collectively produce a regulated precision 5 v.d.c.

This regulated precision 5 v.d.c. is supplied as input power to the MICROCONTROLLER 12. A first sense input is provided to the MICROCONTROLLER 12 by a center tap to the voltage divider consisting of resistor 18 of nominal value 47K ohms, and resistor 19 of nominal value 1K ohms. Another, second, sense input is provided by the secondary coil of current sensor transformer 191. The voltage sensed across the resistive divider 18, 19 is multiplied times the sensed current (as translated into voltage internally by an internal resistance of the second sensor input port of the MICROCONTROLLER 12) in and by the MICROCONTROLLER 12. The product of this multiplication serves as an indication of the instantaneous power in watts that is being supplied to the LOAD. The schematic of FIG. 1 is thus of an electronic wattmeter.

To the extent that the current sensor transformer 191 needs be a robust precision component, then this adds to the cost of the prior art electronic wattmeter 1 shown in FIG. 1.

A schematic block diagram showing a current transformer-less electronic wattmeter 2 in accordance with the present invention is shown in FIG. 2. The preferred embodiment depicted is intended for use with a source of alternating current (a.c.) electrical power, normally a power grid or POWER LINE, that is supplying alternating current (a.c.) voltage electricity to a LOAD, normally a building or the like. The preferred wattmeter includes a direct current power supply, floating relative to a ground, that produces a direct current (d.c) voltage that is impressed upon the a.c. voltage electricity.

This direct current power supply includes all the components between 8:1 stepdown power transformer 21 and diode 22, and the d.c. filter capacitor 23, and also the VOLTAGE REGULATOR 24 and associated bias resistances 25, 26. Notably the half-wave rectified and filtered voltage supplied to the VOLTAGE REGULATOR 24 is the same 20 v.d.c. as in the prior art circuit of FIG. 1, and the +5 v.d.c output of the VOLTAGE REGULATOR 24 is also the same as in the prior art circuit of FIG. 1.

The d.c. ground is "floating" relative to a.c. ground. In other words, the d.c. power supply is substantially the same as in the prior art save only that it is floating. Both the developed d.c. voltages (relative to d.c. ground), and the d.c. ground itself, are floating approximately 100 v.a.c. root mean square (rms) above a.c. ground, as indicated in FIG. 2.

The MICROCONTROLLER 27 the same as in the prior art circuit of FIG. 1.

A first sense input, or first voltage, is provided to the MICROCONTROLLER 27 by a center tap to a first resistive voltage divider consisting of resistor 294 having a nominal value of 1K ohms and resistor 295 having a nominal value of 47K ohms — similar to the prior art resistive voltage divider of resistors 18, 19 shown in FIG. 1. This first resistive voltage divider is located between (i) a side of the series sense resistor 28 that is connected to the source of a.c. electrical power and (ii) the a.c. ground.

Now, however, a sense resistor 28 is located in series between the source of a.c. electrical power and the load. Because the full input current is dropped across this sense resistor 28, which is in series with the LOAD, the value of this resistor 28 is preferably very small, and is typically 0.001 ohms. The value of the sense resistor 28 need only be large enough to produce, across the permissible range of input currents a, voltage difference the magnitude of which is capable of being sensed by the MICROCONTROLLER 27.

A second resistive divider, consisting of resistors 29, 291, of nominal values 27K ohms each, is located between (i) the side of the series sense resistor 28 that is connected to the source of a.c. electrical power and (ii) the floating d.c. ground. A center tap to this second resistive voltage divider voltage develops a second voltage.

A third resistive divider, consisting of resistors 292, 293 or nominal values 27K ohms each, is located between (i) a side of the series sense resistor 28 that is connected to the load and (ii) the floating d.c. ground. A center tap to this third resistive voltage divider develops a third voltage.

Each of the first through third voltages are sensed by the MICROCONTROLLER 27. The sensed first voltage is relative to a.c. ground. However, both the sensed second voltage, and the sensed third voltage, are full floating relative to a.c. ground.

The sensed first voltage is indicative of the instantaneous voltage of the source of a.c. electrical power. Meanwhile, the difference between the sensed second voltage and the sensed third voltage is indicative of the voltage drop across the sense resistor 28, and thus, equivalently, the instantaneous current though the sense resistor 282, and thus, equivalently save only for the infinitesimal amount passing through the voltage divider of resistors 292, 293, of the nearly the identical instantaneous current into the LOAD.

The MICROCONTROLLER 27 multiplies the instantaneous voltage by instantaneous current to develop the instantaneous power, in watts, that is provided by the source of a.c. electrical power to the LOAD.

Because power is lost in the series sense resistor 28 due to current in the LOAD, this resistance is normally very small, and is preferably less than 0.01 ohm and more preferably 0.001 ohm.

The resistances of the resistors 294, 295 in the first resistive voltage divider are such so as to make the first voltage of a proper level for sensing by the MICROPROCESSOR 27, and are normally in a ratio of less than one in fifty (<2%), and are commonly, as previously stated, 1K ohms and 47K ohms.

The resistances of each of the two resistors in each of the first and the second resistive dividers are preferably respectively equal to the resistances of the resistors of the other divider, and are more preferably equal to each other — thus making that all the four resistors of the two resistive dividers are of equal ohms value, and are commonly 27K ohms.

The preferred MICROCONTROLLER 27 will be understood to include an analog to digital (A/D) converter for digitalizing the first through third sensed voltages as well as a microprocessor for multiplying the digitalized voltages. The preferred (A/D) converter must be sensitive to small a.c. currents across the (preferably) small series sense resistor 28, and is normally so sensitive, having better than millivolt sensitivity. The A/D converter and the microprocessor of the MICROCONTROLLER 27 are preferably integrally packaged, and are more preferably part number MC 16C71-04P available from Motorola, Inc.

The MICROCONTROLLER 27 also preferably maintains real time by an internal clock, and integrates measured watts electricity consumption over time to develop electrical power consumption in watt hours.

The MICROCONTROLLER 27 is also preferably digitally interfaced to each of a radio (i) transmitter, and (ii) receiver, and is programmed to report by radio in response to demands received by radio each of the instantaneous rate of electricity consumption (watts) and the consumption of electricity over a period (watt-hours), as is next discussed. By such a connection, and by preferred communications and communications protocol, instantaneous and cumulative electrical power consumption as are both monitored by the electronic voltmeter of the present invention are reported from one radio-communicating monitor to another in a relay ultimately reaching to an demand-originating, and usage information receiving, central station.

The preferred embodiment of an electronic voltmeter in accordance with the present invention may be provided with a digital readout connected to its MICROCONTROLLER 27, and used as a stand-alone monitor of electrical power consumption. However, it is also possible to use the preferred embodiment of an electronic voltmeter in accordance with the present invention in a larger, radio-communicating, remotely interrogated and read utility meter called a Demand Relay Meter, or DRM. The function and design of the DRM are straightforward. FIG. 3 shows a schematic block diagram of the functional elements within the DRM.

The only required electrical connection to the DRM is to read the voltage and current. The power measurement requires the sampling of both the line voltage and the line current. Measurement of the line voltage and the line current is accomplished by sampling the voltage and current at a rate high enough to establish the phase relationship of the two wave forms as a function of time. The power factor can be calculated by dividing the power by the rms values of the current and voltage. The microcontroller will produce the power reading by multiplying the voltage and current readings. A resulting 8 bit digital byte will be stored in memory once each hour. This process is repeated every hour for 30 days. At the end of the 30 day period the oldest reading is replaced with a new power reading.

Voltage sampling requires a close tolerance resistor divider to bring the line voltage level down to around 5 volts. This reduced voltage can then be digitized directly by an existing analog to digital converter (A/D) integrated circuit (IC). It is currently possible to buy microprocessor/ microcontroller chips with built in A/D. This greatly simplifies the hardware and minimizes the overall parts count.

Probably the most critical function in the DRM is the current sensing that is performed by the improved electronic wattmeter in accordance with the present invention. Using a floating power supply concept as shown in FIG. 2 in the DRM provides a current sensing technique that eliminates the high-cost current sensing transformer. Using resistor dividers to sense current improves accuracy as well as reduces cost.

The heart of the DRM is the microcontroller. The price and capability of this particular part is what makes the DRM feasible. Computer advancements are well advertised with respect to speed and amount of memory. Equally noteworthy is the cost and availability of small inexpensive microcontrollers. This particular part is in the fast track development category and the current low price is directly related to the production volume. Anti-lock brakes and other automotive applications have created an enormous market for these small microcontrollers and several manufacturers have responded with competing devices. The DRM can now profit from this evolutionary development.

A member of the family of small inexpensive microcontrollers suitable for the DRM application is the MC68HC05 chip produced by Motorola. The features offered in this device are impressive even ignoring the extremely low price. Some the features are: 1) external interrupt capability on 4 I/O pins, 2) fully static operation with no minimum clock speed, 3) computer operating properly (COP) watchdog, 4) 15-bit multi-function timer with real-time interrupt circuit, 5) power-saving and data-retention mode, and 6) direct, indirect and relative addressing modes.

Another development that simplifies the DRM is non-volatile memory. Instead of using battery backup for stored data, non-volatile Electrically Erasable Programmable Read Only Memory (EEPROM's) are used. Previously, the rewrite limitation prevented EEPROM's from being used to record renewable data. EEPROM's currently have rewrite endurance's greater than 100,000 erase/write cycles. This rewrite capability in a 16 k bit EEPROM will allow the DRM to record and retain the power reading every hour, every day for 30 days and keep updating the recorded information for the life of the meter.

Since a battery is not required to maintain the memory, another relatively new component was incorporated to provide limited operation in the event of a power failure. This operational extension allows the DRM to send an alarm over the RF link if a power disconnect takes place and also allows the disconnect time to be recorded. The new component that provides the extended power life is a "Super Capacitor". A super capacitor is nothing more than a capacitor that retains enough energy to power the DRM for a limited time after the primary power is shut off. Only in the last few years have capacitors become available with sufficient capacity for this purpose.

The final elements of the DRM needed to accomplish the size, price and performance requirements are the RF receiver, transmitter and antenna. A survey of existing ICs established the existence of receiver chips developed for broadcast receivers and pagers. This led to an investigation of frequency band availability in the VHF range. A number of phone calls led to an introduction to the UTC Service Corporation located at 1140 Connecticut Avenue, Washington, D.C. Their services are used extensively by the utility industry, and historically they were a part of the utility industry.

The UTC Service Corporation was contacted to determine whether or not a frequency allocation would be attainable. For example, and considering San Diego County California as an exemplary area supplied by a single electric utility (San Diego Gas and Electric Company, or SDG&E), it was reported on Jul. 17, 1994 that the UTC computer data base showed at least two frequencies were available in the immediate San Diego area. These two frequencies were 173.3625 Mhz and 173.2625 Mhz. They were narrow band, about 6 Khz, and are referred to as "splinter frequency bands". Most if not all the metropolitan areas in the US would have a few splinter frequency bands available. This input was considered very important because of the following reasons:

First, free space losses decrease as a function of the frequency squared and coverage is easier to achieve at VHF than at higher frequencies.

Second, power transistors are more plentiful and less expensive at the lower frequencies.

Third, instrumentation needed to develop and test circuits at VHF is less expensive, more comprehensive and easier to use.

Fourth, lumped constant components can be used at VHF rather than distributed constant design.

Fifth, omni-directional coverage is a necessity for the DRM application and omni-directional short stub antennas work well at VHF.

Sixth, the narrow splinter frequency band will simplify impedance matching the antenna.

Final selection of components is a function of individual designs, but a common receiver is the MC13135, Dual Conversion Narrowband FM Receiver manufactured by Motorola. This IC offers the following features: 1) complete dual conversion fm receiver-antenna input to audio output, 2) low impedance output, 3) buffered first local oscillator (lo) output to drive phase lock loop, and 4) a Colpitts first local oscillator design for a crystal or voltage controlled oscillator.

Once the receiver is selected, either a simple frequency multiplier or a frequency synthesizer IC will be required to drive the final transmitter transistor. All the range calculations indicate that 1 watt of output power should provide adequate range and not jam another similar RF link up to 100 miles away.

Figure 4:
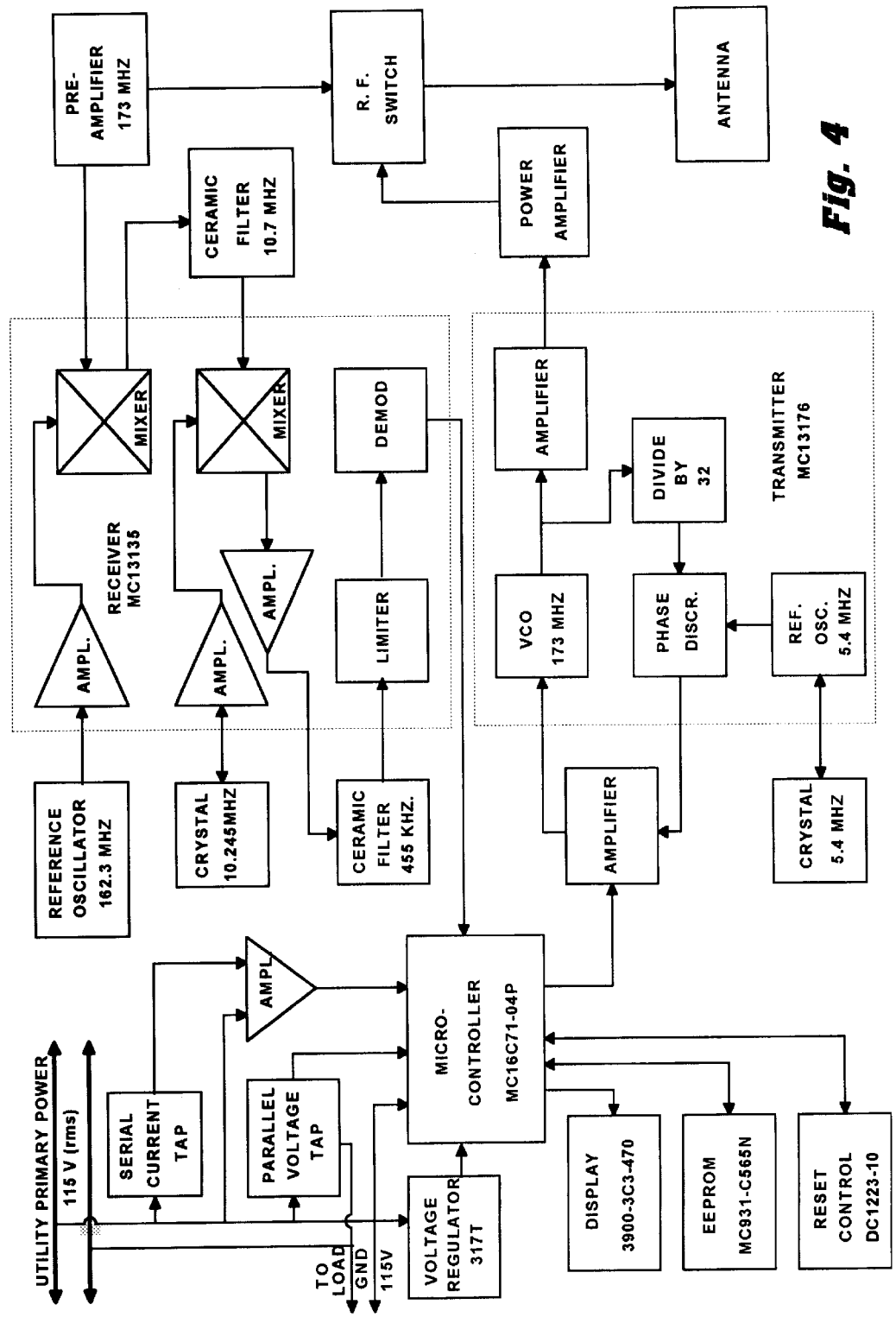
FIG. 4 is a schematic diagram of the preferred embodiment of the Demand Relay Meter, incorporating the preferred embodiment of the current transformer-less electronic wattmeter in accordance with the present invention, that was previously seen in block diagram in FIG. 3.

The functional block diagram previously shown in FIG. 3 is expanded as an electrical schematic block diagram in FIG. 4 in order to show details within each major function. The design objective is to obtain the functionality shown with a minimum parts count.

Features of the design shown in FIG. 3 are: 1) input transient protection (lightning and surges), 2) independent current and voltage measurements on each line, 3) stabilized power supply to handle brown-outs and voltage drops, 4) a microprocessor with integral A/D, CPU, memory, and I/O, 5) a transmitter with stable frequency control, BFSK modulation, and 1 watt output, and 6) a sensitive receiver with pre-selection filter for interference reduction.

The sensor and input sections of the DRM are preferably mechanically interchangeable with form 2S wattmeters. Lightning protection is in the form of sparks gaps plus surge arresters across the input lines.

The current sensors use the series resistor and the floating power supply to avoid the expense and inaccuracy inherent in use of a current transformer. This circuit is preferably configured to handle the full load current of 100 amperes. Calibration to the required accuracy is accomplished by storing calibration constants in the microprocessor memory during initial test. These constants are stored in the non-volatile memory.

The power supply of the DRM uses a transformer, full wave bridge, energy storage and a DC to DC converter to provide a stable power source. The power supply operates with loss of is either input and under brownout conditions. An extremely high capacitance capacitor (Super Cap) is preferably used for energy storage adequate to allow an alarm transmission upon loss of power if desired. The components are preferably surface mounted to meet the objective of low touch labor content.

The microprocessor/microcontroller and memory may be selected from among many candidates, many of which are low-cost. Two such microcontrollers are the Motorola MC 6805S2 and the Texas Instruments TSS400. Salient features of the two units are as follows:

| MOTOROLA | TEXAS INSTRUMENTS |
| --- | --- |
| MC 6805S2 | TSS400 |
| A/D 4 Channel | 4 Channel |
| Multiplex 8-Bit | Multiplex 12-Bit |
| ROM | RAM |
| Digital I/O | Serial I/O |
| LCD Display Drive | No Display Drive |

Either of the candidate microcontrollers match the block diagram with the TI unit having greater accuracy plus the display drive capability. However; the TI unit, being newer, is also more expensive at the present time. An exhaustive survey of current units is indicated prior to making a final selection for any particular design.

The DRM design requires an EEPROM (Electrically Erasable Programmable Read Only Memory) component for the purpose of providing a non volatile store of meter readings and time/date information. A microcontroller with the desired A/D function and EEPROM has not been located circa 1995. However, it is likely that such a controller may now exist or be available in the future. Moreover, a single chip transmitter receiver is realistic for high volume production.

Final selection of components should be made as part of an individual design for application at an individual electric utility, but a suitable receiver component is the Motorola MC 13135 dual conversion narrowband FM receiver. This IC offers a complete FM receiver with dual conversion and FM discriminator. This constitutes the receiver chain from the pre-selector filter output to the data input to the processor as shown in FIG. 10 (approximately ⅓ of the Rx/Tx function).

The transmitter chain blocks shown in FIG. 3 use a Qualcomm Corporation direct digital synthesizer modulated with a binary frequency shift keying (BFSK) modulation which in turn is used as the reference in a phase-locked loop to stabilize a VCO used to generate both the first local oscillator and the transmit frequencies. All components in the blocks shown are standard current telecommunication products.

The antenna design has been investigated with respect to the system requirements. The preferred design integrates the antenna with the meter case since external connection and remote antennas are easy targets for vandalism. The first option would be a loop integral to a non conductive portion of the case. The narrow bandwidth simplifies the impedance matching that results, and ensures efficient power transfer.

Cost effective implementation of the transmit/receive function is aided by the presently (circa 1995) on-going explosion in the manufacture of highly integrated RF components for wireless communication. This has been fueled by the rapid cellular phone expansion as well as other wireless communications. The advent of Personal Communication Bands will no doubt accelerate the process.

As a result, there are currently available single chip devices which implement an entire transceiver including power amplifiers, low noise amplifiers, mixers and demodulator. Most require a frequency reference and some off-chip filtering.

The DRM design with a one watt output requirement (+30 dbm) is not currently available in a single chip form. Current technology would probably require a minimum of four chips to implement the transmitter and receiver functions shown in FIG. 4. However, a single chip transmitter receiver is realistic in the time frame projected, and for high volume production.

The preferred frequency of operation is in the VHF range. The exact frequency is subject to revision for application of the DRM in the grid of any particular electric utility after a comprehensive study of ambient background noise, path analysis and component survey.

The UTC Service Corporation was contacted to determine whether or not a frequency allocation would be attainable. It was reported on Jul. 17, 1994 that the UTC computer data base showed at least two frequencies were available in the immediate San Diego area. These two frequencies were 173.3625 Mhz and 173.2625 Mhz. They were narrow band, about 6 Khz, and referred to as "splinter frequency bands". Most if not all the metropolitan areas in the US would have a few splinter frequency bands available. This input was considered important because of the following reasons:

Free space losses decrease as an inverse function of the frequency squared and coverage is easier to achieve at VHF than at higher frequencies. For example, the path loss differential at 1 mile is 15 db comparing 900 Mhz to 170 Mhz.

As a general case, components are cheaper with higher yield of LSI devices at lower frequencies.

A parts list for the preferred embodiment of the Demand Relay Meter shown in FIGS. 3 and 4 is contained within the Table 1 of FIG. 5.

In accordance with the preceding explanation, variations and adaptations of the electronic wattmeter in accordance with the present invention will suggest themselves to a practitioner of the electronic design arts.

In accordance with these and other possible variations and adaptations of the present invention, the scope of the invention should be determined in accordance with the following claims, only, and not solely in accordance with that embodiment within which the invention has been taught.

What is claimed is:

1. An electronic wattmeter for use with a source of alternating current, a.c., electrical power supplying alternating current, a.c., voltage across a load that is connected to an alternating current, a.c., ground, the electronic wattmeter comprising:

a direct current, d.c., power supply, floating relative to the a.c. ground, for producing from the a.c. voltage a direct current, d.c., voltage relative to, and impressed upon the a.c. voltage;

a resistor located in series between, at a first terminal, the source of a.c. electrical power and, at a second terminal, the load;

a first resistive voltage divider having two resistive legs, located between (i) the first terminal of the series resistor and (ii) the a.c. ground, for developing at a point between its two resistive leas a first voltage;

a second resistive voltage divider having two resistive legs, located between (i) the first terminal of the series resistor and (ii) the a.c. voltage, for developing at a point between its two resistive legs a second voltage; and a third resistor voltage divider having two resistive legs, located between (i) the second terminal of the series resistor and (ii) the a.c. voltage, for developing at a point between its two resistive legs a third voltage;

a sensing means, full floating relative to a.c. ground and connected between the d.c. voltage and a d.c. ground, for first sensing the first voltage as indicative of an instantaneous a.c voltage of the source of a.c. electrical power, and for second sensing the difference between the second voltage and the third voltage as indicative of an instantaneous alternating current provided from the source of a.c. electrical power to the load; and a multiplier means, receiving an instantaneous voltage and the instantaneous current from the sensing means, for multiplying the instantaneous voltage by the instantaneous current to develop instantaneous power that is being provided by the source of a.c. electrical power to the load.

2. The electronic wattmeter according to claim 1 wherein the resistor comprises:

a resistor of less than 0.01 ohm resistance located in series between the source of a.c. electrical power and the load;

wherein power lost in the resistor attendant upon current in the load is low.

3. The electronic wattmeter according to claim 1 wherein the first resistive voltage divider comprises:

a first resistor having a resistance equalling a predetermined first number of ohms, in series with a second resistor having a resistance equalling a predetermined second number of ohms;

and wherein the second resistive divider comprises:

a third resistor also having a resistance equalling a predetermined third number of ohms, in series with a fourth resistor having a resistance in ohms that is within 10% of predetermined third number of ohms;

and wherein the third resistive divider comprises:

a fifth resistor having a resistance in ohms that is also within 10% of the predetermined third number of ohms, in series with a sixth resistor again having a resistance in ohms that is again within 10% of the predetermined third number of ohms.

4. The electronic wattmeter according to claim 3 and wherein the ratio of the predetermined second number of ohms to the predetermined first number of ohms is less than 2%.

5. The electronic wattmeter according to claim 1 wherein the sensing means comprises:

an analog to digital converter for first sensing and for second sensing.

6. The electronic wattmeter according to claim 1 wherein the multiplier means comprises:

a microprocessor.

7. A method of electronically determining the wattage provided by a source of alternating current, a.c., electrical power that supplies alternating current, a.c., voltage across a load that is also connected to an alternating current, a.c., ground, the method comprising:

floating a direct current, d.c., power supply, relative to the a.c. ground so as to produce from the a.c. voltage a direct current, d.c., voltage that is relative to, and impressed upon, the a.c. voltage;

locating a resistor in series between, at a first terminal, the source of a c. electrical power and, at a second terminal, the load;

first developing in a first resistive voltage divider, located between (i) the first terminal of the series resistor and (ii) the a.c. ground, a first voltage;

second developing in a second resistive voltage divider, located between (i) the first terminal of the series resistor and (ii) the a.c. voltage, a second voltage; and third developing in a third resistor voltage divider, located between (i) the second terminal of the series resistor and (ii) the a.c. voltage, a third voltage;

first sensing in a sensing means, connected between the d.c. voltage and a d.c ground while remaining full floating relative to a.c. ground, the first-developed voltage as indicative of an instantaneous a.c. voltage of the source of a.c. electrical power;

second sensing in the sensing means the difference between the second voltage and the third voltage as indicative of an instantaneous alternating current provided from the source of a.c. electrical power to the load; and multiplying in a multiplier means that receives the instantaneous voltage and the instantaneous current from the sensing means instantaneous voltage by the instantaneous current so as to determine the instantaneous power that is being provided by the source of a.c electrical power to the load.

8. The method of electronically detecting wattage according to claim 7 wherein the locating is if a resistor of less than 0.01 ohm resistance;

wherein power lost in the resistor attendant upon current in the load is low.

9. The method of electronic detecting wattage according to claim 7 wherein the second developing is in and at the center tap of the second resistive voltage divider having a third resistor with a resistance equalling a predetermined third number of ohms, in series with a fourth resistor having a resistance in ohms that is within 10% of predetermined third number of ohms; and wherein the third developing is in and at the center tap of the third resistive divider having a fifth resistor with a resistance in ohms that is also within 10% of the predetermined third number of ohms, in series with a sixth resistor again having a resistance in ohms that is again within 10% of the predetermined third number of ohms.

10. The method of electronic detecting wattage according to claim 7 wherein the first developing is in and at the center tap of the first resistive voltage divider having a first resistor of a first resistance in ohms in series with a second resistor of a second resistance in ohms where the ratio of the second resistance to the first resistance is less than 2%.

11. The method of electronic detecting wattage according to claim 7 wherein each of the first sensing and the second sensing is in and by an analog to digital converter.

12. The method of electronic detecting wattage according to claim 7 wherein the multiplying is in and by a microprocessor.

13. An electronic wattmeter for use with a source of a.c. electrical power supplying a.c. voltage across a load, the electronic wattmeter comprising:

a d.c. power supply floating relative to one, first, leg of the a.c. power for producing a d.c. voltage impressed upon the a.c. voltage of this first leg;

a resistor connected in electrical series in the first leg between the source of a.c. power and the load;

a first resistive divider connected on the load first side of the series resistor and the d.c. voltage;

a second resistive divider connected between the side of the series resistor where exists the source of a.c. power and the d.c. voltage;

wherein any difference between the voltage outputs of the first and of the second resistive dividers is indicative of, as well as the resistance of the series resistor, a flow of current through both the series resistor and the load;

a third resister divider between the d.c. voltage and the remaining, second, leg of the a.c. power;

wherein any difference between the voltage outputs of the first and the third resistive divider and the third resistive divider is indicative of a voltage drop across the load;

wherein any difference between the voltage outputs of the second and the third resistive divider is indicative of a voltage drop across both the series resistor and the load;

a full-floating sensor, connected between the d.c. voltage and the first-leg a.c. voltage, for sensing the voltage outputs of the first, second and third resistive dividers as indicative of both (i) a voltage drop across the load between the first and the second legs of a.c. power, and (ii) current flow through the load between the first and the second legs of a.c. power, which is further indicative of the a.c. power consumed by the load.

* * * * *